(12) United States Patent
Fattaruso

(10) Patent No.: US 6,850,104 B2
(45) Date of Patent: Feb. 1, 2005

(54) MASTER-SLAVE LATCH WITH TRANSPARENT MODE

(75) Inventor: John W. Fattaruso, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 142 days.

(21) Appl. No.: 10/385,114

(22) Filed: Mar. 10, 2003

(65) Prior Publication Data
US 2004/0179520 A1 Sep. 16, 2004

(51) Int. Cl.[7] .............................................. H03K 3/289
(52) U.S. Cl. ..................................... 327/202; 327/211
(58) Field of Search ................................. 327/199–204, 327/208, 210–215, 218–219

(56) References Cited

U.S. PATENT DOCUMENTS

| | | | |
|---|---|---|---|
| 4,727,265 A | 2/1988 | Nanbu et al. ................. 326/89 |
| 5,079,452 A | 1/1992 | Lain et al. ................... 327/223 |
| 5,146,362 A | 9/1992 | Copenhaver et al. ........ 359/353 |
| 5,164,612 A | 11/1992 | Kaplinsky ................... 327/108 |
| 6,191,629 B1 | * 2/2001 | Bisanti et al. ............... 327/202 |
| 6,265,922 B1 | * 7/2001 | Kirsch ......................... 327/199 |
| 6,452,433 B1 | * 9/2002 | Chang et al. ................ 327/202 |
| 6,516,015 B1 | 2/2003 | Kimura .................... 372/38.02 |
| 6,624,677 B1 | * 9/2003 | Wissel ......................... 327/202 |

* cited by examiner

Primary Examiner—My-Trang Nu Ton
(74) Attorney, Agent, or Firm—W. Daniel Swayze, Jr.; W. James Brady; Frederick J. Telecky, Jr.

(57) ABSTRACT

A latch device is provided having a latch mode and a transparent mode. In the latch mode, the latch device synchronizes a data signal to a clock signal. In the transparent mode, the data signal drives the output without clock synchronization, such that the clock input signal is unused. The latch device can be employed in an optical driver for optical network laser diodes.

21 Claims, 5 Drawing Sheets

US 6,850,104 B2

MASTER-SLAVE LATCH WITH TRANSPARENT MODE

TECHNICAL FIELD

The present invention relates to electrical circuits and more particularly to a master-slave latch having a latch mode and a transparent mode. The master-slave latch can be employed in an optical driver for driving optical network laser diodes.

BACKGROUND OF INVENTION

Optical communication systems are a substantial and fast-growing constituent of communication networks. Optical systems are employed in telecommunications systems, cable television systems, and local area networks (LANs). A laser diode is employed for transmitting an optical signal over an optical fiber in such an optical communication system. The laser diode is driven with a constant current supplied by a laser driver. A laser driver for use in an optical signal transmitter in an optical communication system selectively supplies laser-driving current responsive to a digital data signal received. In certain applications, it is desirable to resynchronize the data being transmitted with a clock, for example, when high speed data rates compromise signal integrity. Therefore, some conventional optical network laser drivers operate both in a latched mode and a transparent mode. The latched mode synchronizes the data signal with a clock signal prior to transmission of the signal to the laser diode to reduce jitter associated with the system. The transparent mode transmits the data signal directly to the laser diode.

FIG. 1 illustrates a conventional optical driver 10 for driving an optical network laser light emitting diode (LED). The optical driver 10 includes a latch device 16 (e.g., master-slave latch) and a pair of buffers 12. The latch device 16 receives a data signal (DATA) and a clock signal (CLOCK). The latch device 16 synchronizes the data signal to the clock signal and provides the synchronized data to a first input of a multiplexer 14. The buffers 12 also receive the data signal and provide a buffered version of the data signal to a second input of the multiplexer 14. The buffers 12 can be simple current mode logic (CML) amplifier stages.

The output of the multiplexer 14 is provided to an output driver 18. The output driver 18 drives a laser light emitting diode (LED) according to the data sequence and data rate of the data signal. A select line (SEL) is coupled to the multiplexer 14, the buffers 12 and the latch device 16. The logic state of the select line determines whether the synchronized version of the data signal via the latch device 16, or the buffered version of the data signal via the buffers 12 is to be transmitted to the output driver 18.

The power required at the output of the driver 18 to the laser LED is substantially higher than the power of the data into the optical driver 10. Therefore in designing the optical driver 10, each successive stage in both the latch device 16 and the unlatched buffers 12 operate at gradually increased power levels to optimize propagation delay. Consequently, the multiplexer 14 operates at high power levels, required by the final output driver 18. The power consumption of this multiplexer 14 can be responsible for a significant fraction of the total chip power consumption. The power consumed by the multiplexer 14 must not only be sufficient to supply the base circuit in the final output devices, but also large enough to overcome the parasitic capacitance associated with devices in the non-selected path of the multiplexer 14. Also, the buffers 12 and the latch device 16 contribute to the overall real-estate and power consumption even when they are not part of the selected data path.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to a latch device having a latch mode and a transparent mode based on a state of a select line. The latch device can be employed in an optical driver for driving an optical network laser LED. In the latch mode, the latch device synchronizes a data signal to a clock signal and provides the synchronized data to an output driver to drive an LED. In the transparent mode, the data signal drives the output driver without clock synchronization, such that the clock input signal is unused.

In one aspect of the present invention, the latch is a master-slave latch. The master portion comprises a first amplifier stage and a first regenerative stage, and the slave portion comprises a second amplifier stage and a second regenerative stage. A mode selector determines if the master-slave latch operates in a latch mode or a transparent mode. A first clock circuit is associated with the master portion and a second clock circuit is associated with the slave portion. In the latch mode, the first clock circuit and the second clock circuit cooperate to latch a data signal from an input of the master-slave latch to an output of the master-slave latch to synchronize the data signal with a clock signal. The first and second clock circuits are disabled in the transparent mode, such that the data signal is transmitted from an input of the first amplifier stage to an output of the master-slave latch without clock synchronization.

In one aspect of the present invention, the master-slave latch is comprised of bipolar current mode logic (CML) devices. In the latch mode, a set of clock current sources are selected that provide operation of the master-slave latch in the latch mode by steering current through the clock circuitry. In the transparent mode, a set of bypass current sources are selected that bypass the clock circuitry, so that the data input signal is driven directly to the output of the master-slave latch without clock synchronization.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention relates to a latch device having a latch mode and a transparent mode. The latch device can be employed in an optical driver for optical network laser diodes. In the latch mode, the latch device synchronizes the data signal to the clock signal and provides the synchronized data to an output driver to drive a laser LED. In the transparent mode, the data signal drives the output driver without clock synchronization, such that the clock input signal is unused.

In one aspect of the present invention, the latch is a master-slave latch. A first clock circuit is associated with the master portion and a second clock circuit is associated with the slave portion. The first clock circuit and the second clock circuit cooperate to latch a data signal from an input of the master-slave latch to an output of the master-slave latch to synchronize the data signal with a clock signal in the latch mode. The first and second clock circuits are disabled in the transparent mode, such that the data signal is transmitted from an input to an output of the master-slave latch without clock synchronization.

Figure 2:
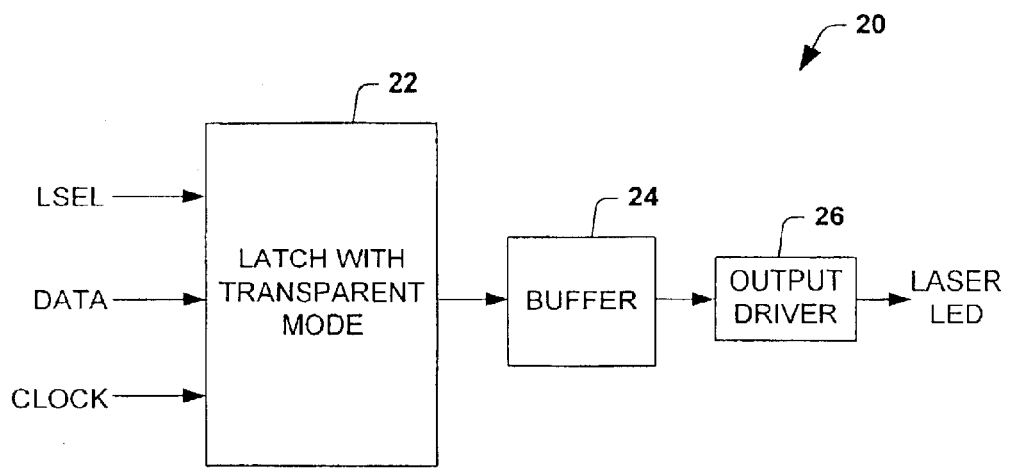
FIG. 2 illustrates a driver for optical network laser diodes in accordance with an aspect of the present invention.

FIG. 2 illustrates an optical driver 20 for optical network laser diodes in accordance with an aspect of the present invention. The optical driver 20 includes a latch device 22 (e.g., master-slave latch) that operates in one of a transparent mode and a latch mode. The latch device 22 receives a data signal (DATA) and a clock signal (CLOCK). The latch device 22 also receives a latch select line (LSEL) that determines whether the latch device 22 operates in the transparent mode or the latch mode. In the latch mode, the latch device 22 synchronizes the data signal to the clock signal and provides the synchronized data to a buffer stage 24. The buffer stage 24 provides the data to an output driver 26, which drives a laser LED "ON" and "OFF" based on the sequence of logic transitions of the data signal. The power consumed by the buffer stage 24 is the minimum power required to drive the output device driver 26. In the transparent mode, the data signal drives the buffer stage 24 and the output driver 26 without clock synchronization, such that the clock input signal is unused.

Typically, bit rates of optical networks are typically above 1 gigabit per second (Gb/s). Therefore, in one aspect of the invention, the optical driver of FIG. 2 employs differential bipolar current mode logic (CML). However, in a bipolar complementary metal oxide semiconductors (BiCMOS) process, the logic inputs that determine the mode of the master-slave latch can be a low frequency CMOS input.

Figure 3:
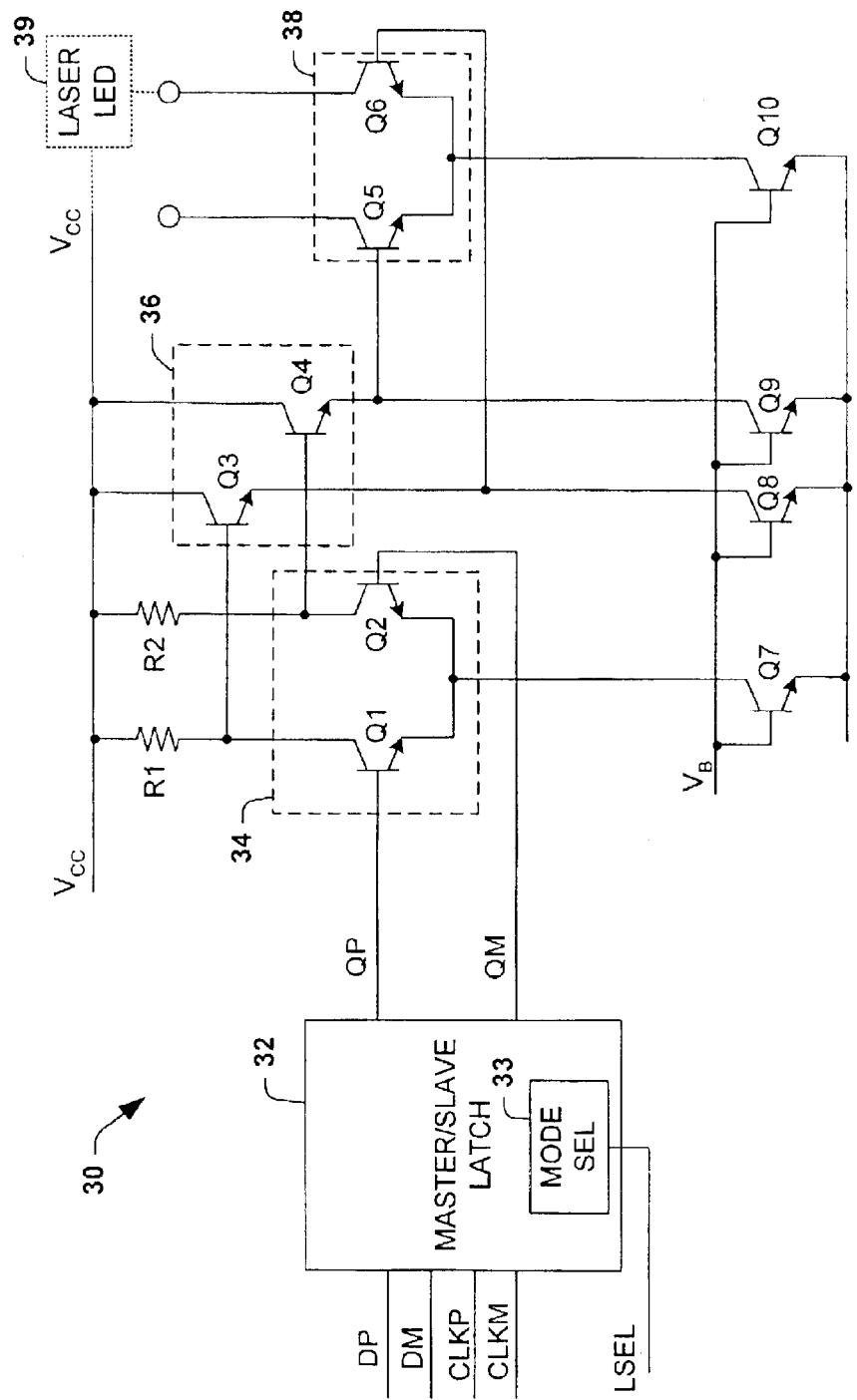
FIG. 3 illustrates a laser LED driver employing current mode logic (CML) in accordance with an aspect of the present invention.

FIG. 3 illustrates an optical laser driver 30 employing current mode logic (CML) in accordance with an aspect of the present invention. The optical driver 30 includes a master-slave latch 32 that can operate in either a transparent mode or a latch mode employing a mode selector device 33. The master-slave latch 32 receives a differential data signal (DP, DM) and a differential clock signal (CLKP, CLKM). The mode selector device receives a latch select line (LSEL) that determines whether the master-slave latch 32 operates in the transparent mode or the latch mode. In the latch mode, the master-slave latch 32 synchronizes the differential data signal to the differential clock signal, and provides synchronized differential data at an output of the master-slave latch 32. In the transparent mode, the data signal is driven directly to the output of the master-slave latch 32 without clock synchronization, for example, by disabling clock circuitry associated with the master-slave latch 32.

The output of the master-slave latch 32 includes a positive logic output signal (QP) and a negative logic output signal (QM). The output QP and QM of the master-slave latch 32 is provided to a buffer device 34 formed of a differential emitter coupled pair. The differential emitter coupled pair includes a first transistor Q1 and a second transistor Q2 having emitters coupled to a transistor Q7 that is configured as a current source. The collector of the first transistor Q1 is coupled to a supply voltage $V_{CC}$ through a resistor R1, and the collector of the second transistor Q2 is coupled to the supply voltage $V_{CC}$ through a resistor R2. The positive logic output signal (QP) drives the base of the first transistor Q1, and the negative logic output signal (QM) drives the base of the second transistor Q2.

If the positive logic output signal (QP) is in a high state and the negative logic output signal (QM) is in a low state, the transistor Q1 turns "ON", while the transistor Q2 is "OFF. Current then flows through the resistor R1 and the transistor Q1 set by the current source Q7. This provides a low signal at the collector of the first transistor Q1 and a high signal at the collector of the second transistor Q2. If the positive logic output signal (QP) is in a low state and the negative logic output signal (QM) is in a high state, the transistor Q2 turns "ON", while the transistor Q1 is "OFF. Current then flows through the resistor R2 and the transistor Q2 set by the current source Q7. This provides a low signal at the collector of the second transistor Q2 and a high signal at the collector of the first transistor Q1. The collectors of the first and second transistors Q1 and Q2 switch between opposing logic states based on the state of the positive and negative logic latch device output of the data signal.

The collector outputs of the transistors Q1 and Q2 are provided to a buffer and level shift stage comprised of a first emitter follower transistor Q3 and a second emitter follower transistor Q4. The collector output of the first transistor Q1 drives the base of the first emitter follower Q3, which is coupled at its collector at the supply voltage $V_{CC}$ and at its emitter through a current source transistor Q8. The collector output of the second transistor Q2 drives the base of the second emitter follower Q4, which is coupled at its collector at the supply voltage $V_{CC}$ and at its emitter through a current source transistor Q9. The emitter outputs of the emitter followers Q3 and Q4 drive an output driver 38 formed of a differential pair of transistors Q5 and Q6. The emitters of the transistors Q5 and Q6 are coupled to a current source formed from a transistor Q10. The collectors of the transistors Q5 and Q6 can be employed to drive a Laser LED. The first emitter follower Q3 drives the base of the transistor Q5 and the second emitter follower Q4 drives the base of the transistor Q6. The collector of either of the transistor Q5 and the transistor Q6 can be coupled to a laser LED. The transistors Q1–Q10 are bipolar junction transistors (BJTs), and the current sources Q7–Q10 are biased "ON" via a bias voltage $V_B$.

In FIG. 3, a laser LED 39 is illustrated with dashed lines in which the laser LED 39 is coupled between the collector of the transistor Q6 and the supply voltage $V_{CC}$. If the data signal output is in a low state (QP/low, QM/high), the transistor Q2 will conduct current with the collector of the transistor Q1 driving the emitter follower Q3. The emitter follower Q3 will then turn on the transistor Q6 causing current to flow through the Laser LED 39, which will then emit light. If the data signal output is in a high state (QP/high, QM/low), the transistor Q1 will conduct current with the collector of the transistor Q2 driving the emitter follower Q4. The emitter follower Q4 will then turn on the transistor Q5 causing current to flow through the transistor Q5 and not the transistor Q6. The Laser LED 39 will not conduct current and will not emit light. As the data signal output transitions between low and high logic states, the Laser LED 39 will turn "ON" (low logic state) and "OFF" (high logic state) according the logic states of the latch device data output signal.

It is to be appreciated that the laser LED 39 can be connected to the collector of the transistor Q5 instead of the transistor Q6. In this situation, the laser LED 39 would turn "ON" when the data signal output is in a high state (QP/high, QM/low), and the laser LED 39 would turn "OFF" when the data signal output is in a low state (QP/low, QM/high). It is to be appreciated that the outputs of the transistors Q5 and Q6 can be employed to drive the Laser LED 39 utilizing other configurations.

Figure 4:
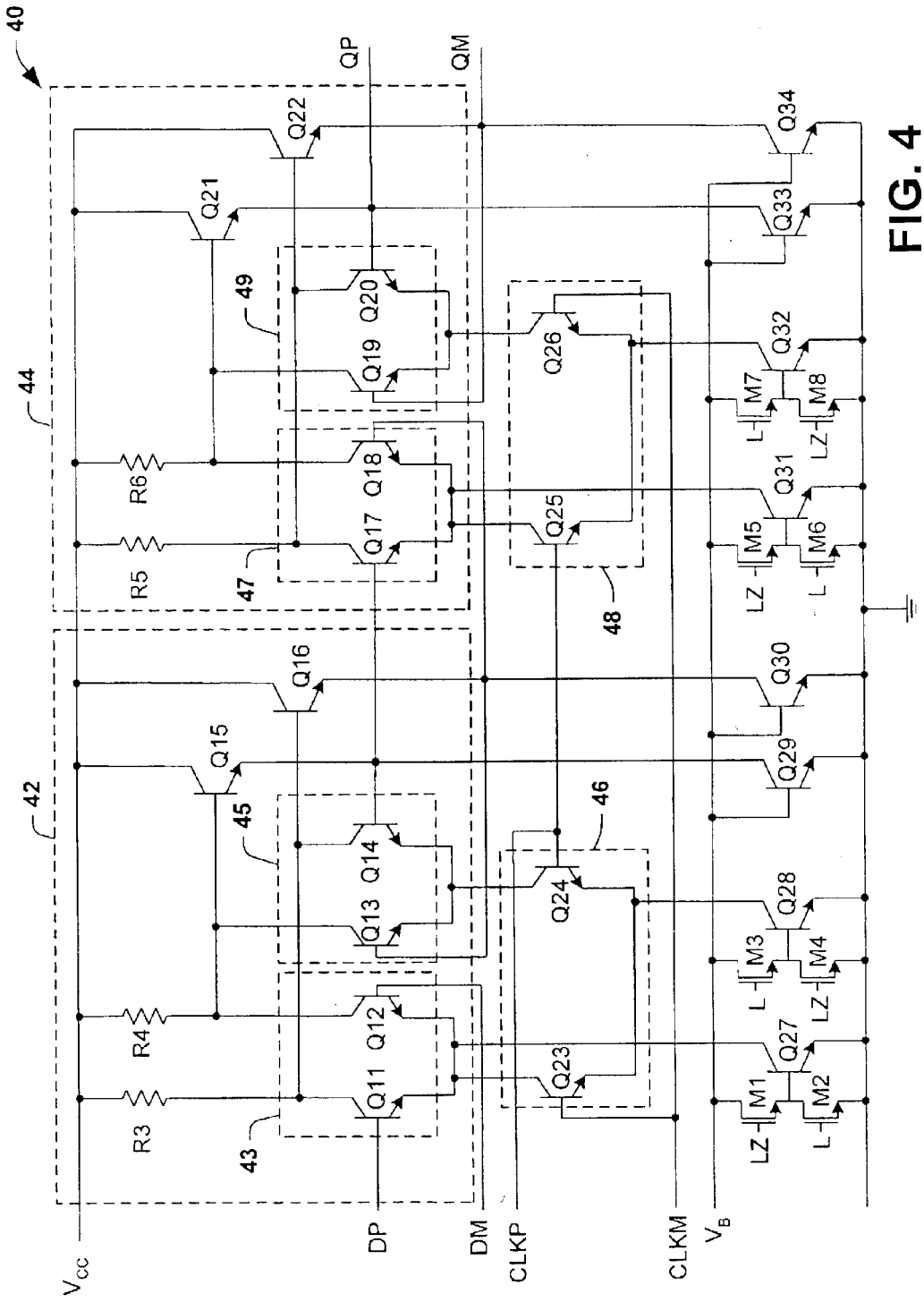
FIG. 4 illustrates a master-slave device having a transparent mode and a latch mode in accordance with an aspect of the present invention.

FIG. 4 illustrates a master-slave device 40 having a transparent mode and a latch mode in accordance with an aspect of the present invention. A state of a select line (L, LZ) determines whether the master-slave device 40 operates in a transparent mode or a latch mode. In a first state of the select line, a first set of current sources are selected that provide operation of the master-slave latch 40 in the latch mode (i.e., normal operation). In a second state of the select line, a second set of current sources are selected that provide operation of the master-slave latch 40 in the transparent mode. In the transparent mode, the second set of current sources bypass clock steering circuitry of the master-slave device 40 and disable a first and a second regenerative stage (differential pair), so that the data input signal is driven directly to the output of the master-slave latch without clock synchronization.

The master-slave device 40 includes a master latch portion 42 coupled to a slave latch portion 44. The master latch portion 42 includes a first amplifier stage 43 coupled to a first regenerative stage 45. The slave latch portion 44 includes a second amplifier stage 47 coupled to a second regenerative stage 49. The first amplifier stage 43, the first regenerative stage 45, the second amplifier stage 47 and the second regenerative stage 49 are all formed of common emitter differential pairs. The first amplifier stage 43, comprised of transistors Q11 and Q12, receives a differential input data signal (DP, DM), and amplifies the current associated with the differential input data signal to drive a pair of emitter followers Q15 and Q16 based on the logic state of the differential input data signal. The emitter follower Q15 is coupled to ground through a current source transistor Q29, and the emitter follower Q16 is coupled to ground through a current source transistor Q30. The current source transistors Q29 and Q30 are biased "ON" via a bias voltage $V_B$. The collector of the transistor Q11 is coupled to a supply voltage $V_{CC}$ through a resistor R3, and the collector of the transistor Q12 is coupled to the supply voltage $V_{CC}$ through a resistor R4.

A first clock current steering circuit 46 is comprised of a differential pair of transistors Q23 and Q24 coupled to the emitters of the transistors of the first amplifier stage 43 and the emitters of the transistors of the first regenerative stage 45. The first clock current steering circuit 46 steers the current through one of the transistors Q11 and Q12 and associated resistors R3 and R4 based on the logic state of the differential input data signal during a first state of the differential clock signal (e.g., CLKP/low, CLKM/high). The first regenerative stage 45 is comprised of transistors Q13 and Q14. The first clock current steering circuit 46 steers the current through one of the transistors Q13 and Q14, based on the logic state of the emitter followers Q15 and Q16 during a second state of the differential clock signal (e.g., CLKP/high, CLKM/high). The first regenerative stage 45 latches the logic state of the first amplifier stage 43 during the second state of the differential clock signal.

It is to be appreciated that during the first state of the differential clock signal, the transistor Q23 steers current through the first amplifier stage 43, and during the second state of the differential clock signal the transistor Q24 steers current through the first regenerative stage 45. During the second state of the differential clock signal, any change in data input to the first amplifier stage 45 does not affect the output of the emitter followers Q15 and Q16, such that the data is in a latched state.

The output of the emitter followers Q15 and Q16 are coupled to the inputs of the second amplifier stage 47. The second amplifier differential pair, comprised of transistors Q17 and Q18, receives a differential input signal from the emitter followers Q15 and Q16, and amplifies the differential input signal to drive a second pair of emitter followers Q21 and Q22 based on the logic state of the input signal from the first pair of emitter followers Q15 and Q16. The emitter follower Q21 is coupled to ground through a current source transistor Q33, and the emitter follower Q22 is coupled to ground through a current source transistor Q34. The current source transistors Q33 and Q34 are biased "ON" via the bias voltage $V_B$. The collector of the transistor Q17 is coupled to the supply voltage $V_{CC}$ through a resistor R5, and the collector of the transistor Q18 is coupled to the supply voltage $V_{CC}$ through a resistor R6. A second clock current steering circuit 48 steers the current through one of the transistors Q17 and Q18 and associated resistors R5 and R6 based on the state of the input signal during the second state of a differential clock signal (CLKP, CLKM). The second regenerative stage 49, comprised of transistors Q19 and Q20, latches the state of the second amplifier stage 47 during the first state of a differential clock signal (CLKP, CLKM).

During the second state of the differential clock signal, the transistor Q25 steers current through the second amplifier stage 47. During the first state of the differential clock signal, the transistor Q26 steers current through the second regenerative stage 49. During the first state of the differential clock signal, any change in data input to the second amplifier stage 47 does not affect the output of the emitter followers Q21 and Q22, such that the output of the master-slave latch 40 is in a latched state. During a latch mode, the first amplifier stage 43 and the second regenerative stage 49 operate during a first clock state, and the first regenerative stage 45 and the second amplifier stage 47 operate during a second clock state. Therefore, data provided to the first amplifier stage 43 is latched by the second regenerative stage 49 after a full clock cycle transition has occurred.

A first clock current source transistor Q28 is coupled to the emitters of transistors Q23 and Q24 of the first clock current steering circuit 46. A Metal-Oxide-Semiconductor Field-Effect Transistor (MOSFET) switch comprised of MOSFET devices M3 and M4 receives logic signals L and LZ, respectively, and turns the first clock current source transistor Q28 between an "ON" and an "OFF" state by applying the bias voltage $V_B$ or ground to the base of the first clock current source transistor Q28. The first clock current source transistor Q28 sources current through the first clock current steering circuit 46 in the "ON" state. A second clock current source transistor Q32 is coupled to the emitters of transistors Q25 and Q26 of the second clock current steering circuit 48. A MOSFET switch comprised of MOSFET devices M7 and M8 receives logic signals L and LZ, respectively, and turns the second clock current source transistor Q32 between an "ON" and an "OFF" state by applying the bias voltage $V_B$ or ground to the base of the second current source transistor Q32. The second clock current source transistor Q32 sources current through the second clock current steering circuit 48 in the "ON" state. The master-slave device 40 operates in the latch mode when both the first clock current source transistor Q28 and the second clock current source transistor Q32 are set to "ON" states (i.e., L-logic high, LZ-logic low).

A first bypass current source transistor Q27 is coupled to the emitters of transistors Q11 and Q12. A MOSFET switch comprised of MOSFET devices M1 and M2 receives logic signals LZ and L, respectively, and turns the first bypass current source transistor Q27 between an "ON" and an "OFF" state by applying the bias voltage $V_B$ or ground to the base of the first bypass current source transistor Q27. The first bypass current source transistor Q27 sources bypass current through the first amplifier stage 43 bypassing the first clock current steering circuit 46 when in the "ON" state. A second bypass current source transistor Q31 is coupled to the emitters of transistors Q17 and Q18. A MOSFET switch comprised of MOSFET devices M5 and M6 receives logic signals LZ and L, respectively, and turns the second bypass current source transistor Q31 between an "ON" and an "OFF" state by applying the bias voltage $V_B$ or ground to the base of the second bypass current source transistor Q31. The second bypass current source transistor Q31 sources current through the second amplifier stage 47 bypassing the second clock current steering circuit 48 when in the "ON" state.

In the master-slave latch 40 of FIG. 4, the CMOS logic signals L and LZ are arranged to disable the first and second bypass current source transistors Q27 and Q28, and enable the first and second clock current sources Q28 and Q32 in the latch mode. The CMOS logic signals L and LZ are arranged to enable the first and second bypass current source transistors Q27 and Q28, and disable the first and second clock current sources Q28 and Q32 in the transparent mode.

The master-slave device 40 operates in the transparent mode when both the first bypass current source transistor Q27 and the second bypass current source transistor Q31 are set to "ON" states (i.e., LZ-logic high, L-logic low), and the first clock current source transistor Q28 and the second clock current source transistor Q32 are set to "OFF" states. In the transparent mode, both the first regenerative stage 45 and the second regenerative stage 49 are disabled. Therefore, the first amplifier stage 43 drives the first set of emitter followers Q15 and Q16, and the second amplifier stage 48 drives the second set of emitter followers Q21 and Q22. This condition is usually precluded by the clock current steering when the stage is used as a latch, but in the transparent mode results in a transparent buffer with the required gradual buildup of power level to the outputs QP and QM.

Figure 1:
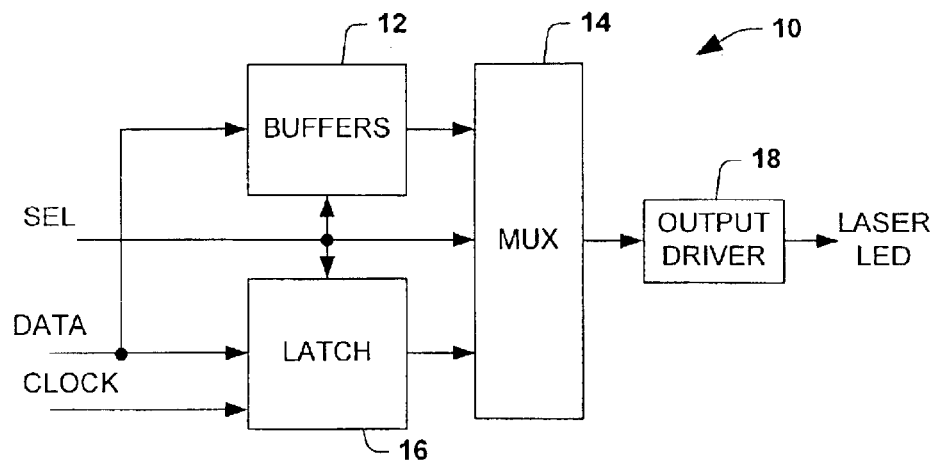
FIG. 1 illustrates a conventional optical driver for driving optical network laser diodes.

It is to be appreciated that the circuitry not being actively employed in either the latch mode, or the transparent is powered down with the L and LZ logic signals, and does not contribute to overall chip power consumption. It is also to be appreciated that considerable silicon chip area savings is achieved by the adoption of the new architecture of FIGS. 2–4, as compared with the conventional device of FIG. 1. The master-slave device of the present invention has been illustrated with respect to an optical network laser LED driver. However, the master-slave device 40 can be employed in a variety of other implementations that desire a transparent mode and a latch mode.

Figure 5:
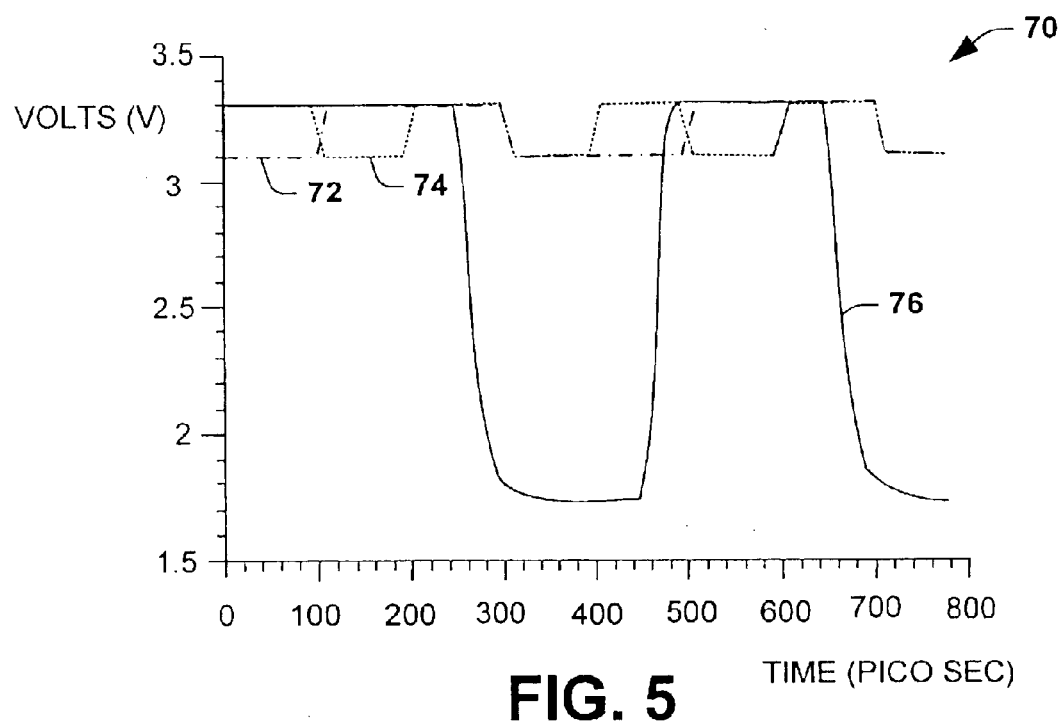
FIG. 5 illustrates a graph of voltage versus time of exemplary data, clock and output signals of the master-slave device of FIG. 4 operating in a latched mode in accordance with an aspect of the present invention.
Figure 6:
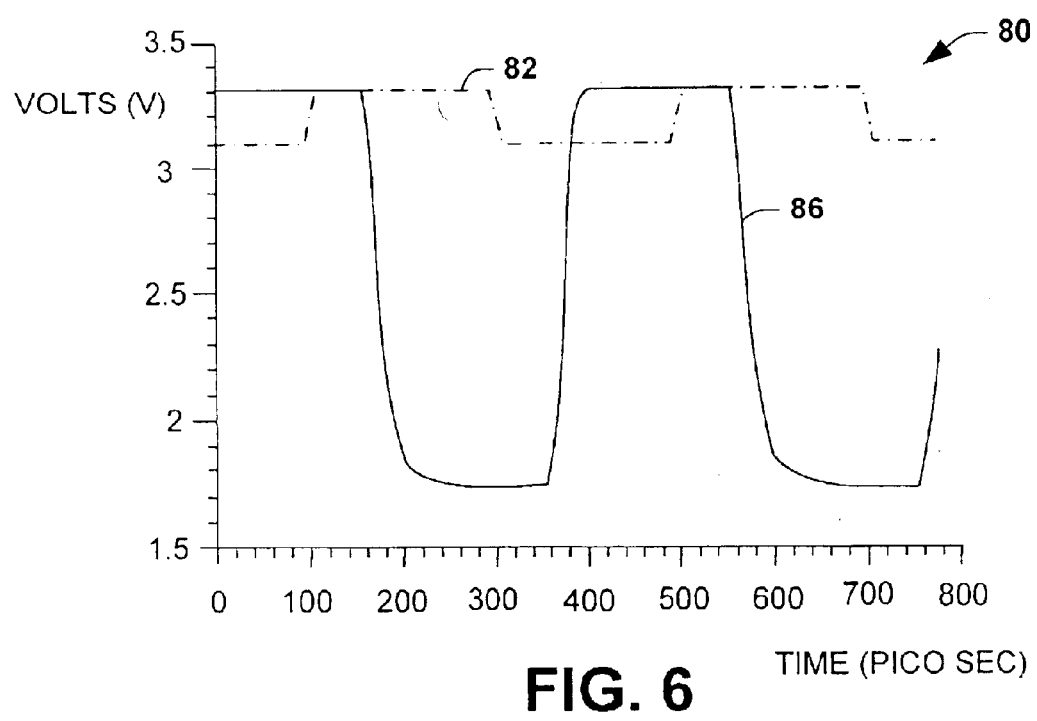
FIG. 6 illustrates a graph of voltage versus time of exemplary data and output signals of the master-slave device of FIG. 4 operating in a transparent mode in accordance with an aspect of the present invention.

FIG. 5 illustrates a graph 70 of voltage (V) versus time (psec) of exemplary data, clock and output signals of the master-slave device of FIG. 4 operating in a latched mode in accordance with an aspect of the present invention. The graph 70 illustrates a positive logic data input signal 72, a positive logic clock signal 74 and an associated negative logic output signal 76. The output signal 76 will follow the input signal 72 with inversion after the rising edge of the clock signal 74. FIG. 6 illustrates a graph 80 of voltage (V) versus time (psec) of exemplary data and output signals of the master-slave device of FIG. 4 operating in a transparent mode in accordance with an aspect of the present invention. The graph 80 illustrates a positive logic data input signal 82 and an associated negative logic output signal 86. The output signal 86 will follow the input signal 82 with inversion without clocking.

Figure 7:
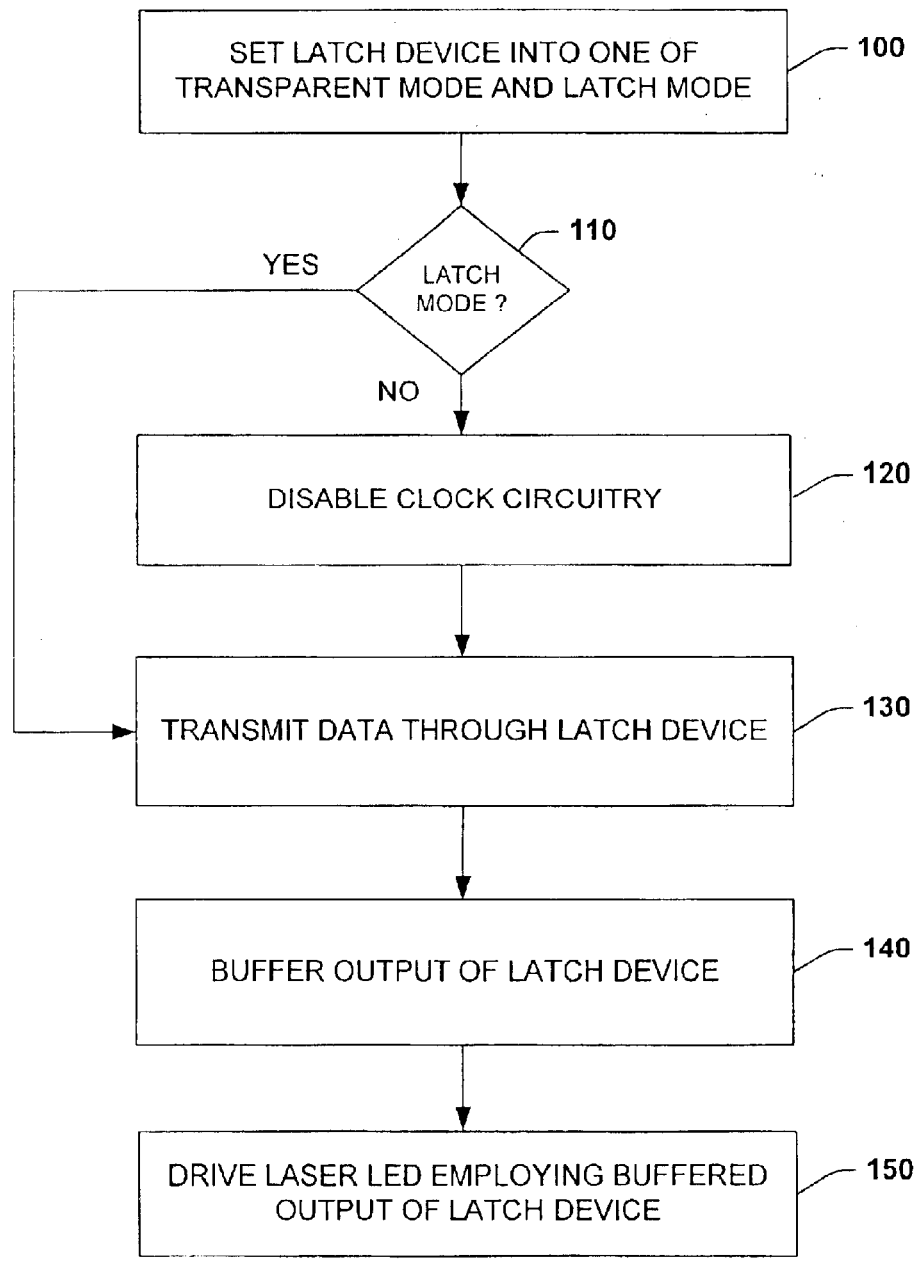
FIG. 7 illustrates one particular methodology for operating a driver for driving a laser LED in accordance with an aspect of the present invention.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 7 illustrates one particular methodology for operating a laser LED optical driver for an optical network in accordance with an aspect of the present invention. The methodology begins at 100 where a latch device of the laser LED optical driver is set to one of a transparent mode and a latch mode. The latch device can be set to a transparent mode or a latch mode by setting a logic select line to one of a high logic state and a low logic state. At 110, a determination is made as to whether the latch device has been set in the latch mode. If the latch device is in the latch mode (YES), the methodology advances to 130. If the latch device is not in the latch mode (NO), the latch device is in the transparent mode and proceeds to 120. At 120, clock circuitry of the latch device is disabled, for example, by the disabling of clock current sources associated with clock circuitry, and enabling bypass current sources that enable the amplifier stages of the latch device, while bypassing the clock circuitry of the latch device. Disabling the clock current sources also disables the regenerative stages of the latch device. In the latch mode, the clock current sources are enabled and the bypass current sources are disabled. The methodology then proceeds to 130.

At 130, data is transmitted to the latch device. The current associated with the data is amplified through the amplifier stages of the latch device to the output of the latch device. The output of the latch device is then buffered to provide additional current gain to the signals at 140. At 150, a laser LED is driven via a driver stage employing the buffered data output of the latch device.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An optical driver for driving a light emitting diode (LED) comprising:
   a latch device selectable between a latch mode and a transparent mode based on a state of a select line, the latch device synchronizes a data signal to a clock signal and provides a synchronized data signal to a latch device output in the latch mode, the latch device drives the data signal to the latch device output without clock synchronization in the transparent mode; and
   an output driver operative to drive a LED based on the data signal from the latch device output.

2. The driver of claim 1, further comprising a buffer coupled between the latch device and the output driver, the buffer provides additional power gain to the data signal for driving the LED.

3. The driver of claim 1, the latch device being a master-slave latch device.

4. The driver of claim 1, the master-slave latch device having a master portion coupled to a slave portion, the master portion comprising a first amplifier stage coupled to a first regenerative stage, and the slave portion comprising a second amplifier stage coupled to a second regenerative stage.

5. The driver of claim 4, the master-slave latch device further comprising a first clocking circuit associated with the master portion and a second clocking circuit associated with the slave portion, the first and second clocking circuit cooperate to latch the data signal from an input of the master portion to an output of the slave portion in response to a clock cycle in the latch mode, the first and second clocking circuit being disabled in the transparent mode, such that the data signal is transmitted from the input of the master portion to the output of the slave portion without clock synchronization.

6. The driver of claim 5, the master-slave latch device further comprising a first clock current source that steers current through the master portion and the first clocking circuit and a second clock current source that steers current through the slave portion and the second clocking circuit, and a first bypass current source that steers current through the first amplifier stage bypassing the first clocking circuit and a second bypass current source that steers current through the second amplifier stage bypassing the second clocking circuit, the first and second clock current sources are selected and the first and second bypass current sources are unselected in the latch mode and the first and second clock current sources are unselected and the first and second bypass current sources are selected in the transparent mode.

7. The driver of claim 4, the first regenerative stage and the second regenerative stage being disabled in the transparent mode.

8. The driver of claim 1, the latch device comprising an amplifier stage and a regenerative stage, and a clock circuit associated with the amplifier stage and the regenerative stage, the clock circuit latches the data signal from an input of the amplifier stage to an output of the regenerative stage in response to a clock cycle in the latch mode, and the clocking circuit is disabled in the transparent mode, such that the data signal is transmitted from the input of the amplifier stage to the output of the regenerative stage without clock synchronization.

9. The driver of claim 8, the latch device further comprising a clock current source that steers current through the clock circuit, and a bypass current source that steers current through the amplifier stage bypassing the clock circuit, the clock current source is selected and the bypass current source is unselected in the latch mode and the clock current source is unselected and the bypass current source is selected in the transparent mode.

10. A master-slave latch comprising:
    a master portion comprising a first amplifier stage coupled to a first regenerative stage;
    a slave portion comprising a second amplifier stage coupled to a second regenerative stage, the first regenerative stage being coupled to the second amplifier stage;
    a first clock circuit associated with the master portion;
    a second clock circuit associated with the slave portion; and
    a mode selector that controls whether the master-slave device operates in one of a latch mode and a transparent mode, the first clock circuit and the second clock circuit cooperate to latch a data signal from an input of the first amplifier stage to an output of the second regenerative stage in the latch mode and the first clock circuit and the second clock circuit being disabled in the transparent mode, such that the data signal is transmitted from the input of the first amplifier stage to an output of the master-slave latch without clock synchronization.

11. The master-slave latch of claim 10, the mode selector comprising a first clock current source that steers current through the master portion and the first clocking circuit and a second clock current source that steers current through the slave portion and the second clocking circuit, and a first bypass current source that steers current through the first amplifier stage bypassing the first clocking circuit and a second bypass current source that steers current through the second amplifier stage bypassing the second clocking circuit, and switches associated with the first and second clock current sources and switches associated with the first and second bypass current sources, such that first and second clock current sources are selected in the latch mode and the first and second bypass current sources are selected in the transparent mode via the associated switches.

12. An optical driver comprising the master-slave latch of claim 10 in combination with an output driver, the output driver operative to drive a LED based on the sequence of the data signal received from the master-slave latch.

13. The master-slave latch of claim 10 being formed of differential bipolar current mode logic devices, the master portion drives a first emitter follower pair and the slave portion drives a second emitter follower pair, the second emitter follower pair provides a final output signal of the master-slave latch.

14. The master-slave latch of claim 13, the first regenerative stage and the second regenerative stage being disabled in the transparent mode, such that the first amplifier stage drives the second amplifier stage, the second amplifier stage drives the final output of the master-slave device.

15. An optical network driver for driving a laser light emitting diode (LED), the driver comprising:

a latch device comprising:

means for synchronizing a data signal in a latch mode in response to a clock signal and providing the synchronized data signal to a latch device output; and means for selecting between the latch mode and a transparent mode in response to a logic state select line, the means for selecting having means for enabling the means for synchronizing in the latch mode and means for disabling the means for synchronizing in the transparent mode, the latch device drives the data signal to the latch device output without clock synchronization in the transparent mode; and means for driving a LED based on the data signal from the latch device output.

16. The driver of claim 15, further comprising means for providing additional power gain to the data signal of the latch device output prior to providing the latch device output to the means for driving a LED.

17. The driver of claim 15, the latch device having a master portion and a slave portion, the means for enabling steering current through the master portion and slave portion and through the means for synchronizing in the latch mode, the means for disabling steering current through the master portion and slave portion and bypassing the means for synchronizing in the transparent mode.

18. A method for operating an LED driver for an optical network having a latch mode and a transparent mode, the method comprising:

setting a latch device into one of a transparent mode and a latch mode;

disabling clock circuitry of the latch device associated with synchronizing a data signal if the latch device is set in the transparent mode;

transmitting a data signal from an input of the latch device to an output of the latch device, the data signal being synchronized with a clock signal in the latch mode and transmitted without clock synchronization in the transparent mode; and driving an output driver with the output of the latch device.

19. The method of claim 18, further comprising buffering the output of the latch device prior to driving the output driver with the output of the latch device.

20. The method of claim 18, the latch device having a master portion and a slave portion, the disabling clock circuitry associated with synchronizing a data signal if the latch device is set in the transparent mode comprising disabling at least one current source that steers current through the master portion, the slave portion and the clock circuitry, and enabling at least one bypass current source that steers current through the master portion and latch portion and bypasses the clock circuitry.

21. The method of claim 20, the master portion comprising a first amplifier stage coupled to a first regenerative stage, and the slave portion comprising a second amplifier stage coupled to a second regenerative stage, the disabling clock circuitry associated with synchronizing a data signal if the latch device is set in the transparent mode further comprising disabling the first regenerative stage and the second regenerative stage.

* * * * *